United States Patent [19]
Koren et al.

[11] Patent Number: 5,134,671
[45] Date of Patent: * Jul. 28, 1992

[54] MONOLITHIC INTEGRATED OPTICAL AMPLIFIER AND PHOTODETECTOR

[75] Inventors: Uziel Koren, Fair Haven; Kang-Yih Liou, Holmdel, both of N.J.

[73] Assignee: AT&T Bell Laboratories, Murray Hill, N.J.

[*] Notice: The portion of the term of this patent subsequent to Jun. 3, 2009 has been disclaimed.

[21] Appl. No.: 563,164

[22] Filed: Aug. 3, 1990

[51] Int. Cl.$^5$ .............................................. G02B 6/30
[52] U.S. Cl. .......................................... 385/14; 385/1
[58] Field of Search ..................... 350/96.10–96.14

[56] References Cited

U.S. PATENT DOCUMENTS

| | | | |
|---|---|---|---|
| 4,674,827 | 6/1987 | Izutsu et al. | 350/96.12 |
| 4,760,569 | 7/1988 | Mahlein | 350/96.11 X |
| 4,846,540 | 7/1989 | Kapon | 350/96.12 |
| 4,878,727 | 11/1989 | Boiarski et al. | 350/96.11 X |

OTHER PUBLICATIONS

Koren et al., "Semi-Insulating Blocked Planar . . . ", Electronic Letters, Feb. 4th, 1988, vol. 24, No. 3, pp. 138–139.
Sasaki et al., "Normalised Power Transmission In Single Mode . . . ", Electronic Letters, Feb. 5th, 1981, vol. 17, No. 3, pp. 136–138.
Burns et al., "Mode Conversion in Planar-Dielectric Separating Waveguides", IEEE Journal of Quantum Electronics, vol. QE-11, No. 1, Jan. 1975, pp. 32–39.
Liou et al., "Monolithic Integrated InGaAsP/InP . . . ", Appl. Phys. Lett., 54(2), Jan. 9, 1989, pp. 114–116.

*Primary Examiner*—Akm E. Ullah
*Attorney, Agent, or Firm*—Eli Weiss

[57] ABSTRACT

An optical amplifier and photodetector are monolithically integrated, with the photodetector being optically coupled to the optical amplifier through a low radiative loss and low back reflectivity branching waveguide. Because of the low reflectivity, the branching waveguide, although having a truncated wedge tip, is able to redirect a small portion of optical radiation from the amplifier to the photodetector without deleteriously effecting the performance of the optical amplifier. The branching waveguide is realized by employing between the branches of the waveguide, a junction region having a gradual decrease in effective refractive index such as to decrease the difference between the refractive indices at the optical interface of the truncated wedge tip as seen by optical radiation incident thereto from the optical amplifier.

17 Claims, 6 Drawing Sheets

MONOLITHIC INTEGRATED OPTICAL AMPLIFIER AND PHOTODETECTOR

TECHNICAL FIELD

The present invention relates to semiconductor optical amplifiers and, in particular, to an optical amplifier integrated on a substrate together with a monitoring photodetector.

CROSS-REFERENCE TO RELATED APPLICATION

This application is related to U.S. patent application Ser. No. 07/563,162 (Koren-Liou 11-3), which was filed concurrently herewith.

BACKGROUND OF THE INVENTION

Conventional long haul communication systems comprise both optical and electronic components. For example, repeaters detect light photoelectrically, amplify the resulting current electronically and then use the amplified current to drive a semiconductor laser that reconverts the electrical signal back into an optical signal. The optical signal is then injected into an optical fiber to the next repeater in the system where the conversion from optical to electrical and back again to optical is repeated again.

In an all-optical transmission system, light once generated will be transmitted optically, received by optical detection and, more importantly, amplified optically such that there is no intermediate conversion from optical to electrical and then back to an optical form. Optical amplifiers afford direct optical amplification of an optical signal, which results in the elimination of the electronic processing. Accordingly, optical amplifiers will enable optical communication systems to have repeaters which have higher bandwidths, are physically smaller, simpler in design, more efficient to operate and more economically to produce.

Furthermore, with the performance of optical amplifiers relatively unaffected by changes in data bit rate or by the presence of additional channels at separate wavelengths, optical amplifiers will become key components in lightwave transmission and switching systems. Unfortunately, although optical amplifiers are integrable with other opto-electronic devices in photonic integrated circuits (PICs), it has been problematic to control the output power because the gain of an optical amplifier can be affected by both environmental effects, such as changes in source wavelength and polarization, as well as temperature variations and amplifier degradation. Accordingly, integrating a monitoring detector with the optical amplifier to monitor the output power therefrom seems to be a reasonable solution, other than utilizing bulk detectors and couplers, which are prohibitively lossy and expensive.

Unlike a semiconductor laser wherein a detector may be positioned on the back facet, no facet of the optical amplifier is available because both front and back facets are employed for ingressing and egressing optical radiation. As such, the only viable alternative is to employ an integrated branching waveguide, such as a Y-junction waveguide, to tap a fraction of the output power to monitor the amplifier. Because the injected optical radiation into the optical amplifier can be arbitrarily polarized, the power splitting ratio of the branching waveguide should be polarization invariant in order for the photogenerated current of the integrated detector to be used in a feedback configuration. Disadvantageously, optical amplifiers require more than 40 dB of optical isolation in order to suppress ripples in the gain spectrum resulting from residual Fabry-Perot resonances. Alternatively stated, the back-reflectivity of the Y-junction waveguide should be substantially smaller than the residual reflectivities of the anti-reflective coatings on the end facets of the optical amplifier.

Due to fabrication limitations, practical Y-junction waveguides have truncated wedge tips. See, for example, Sasaki et al., *Electronics Letters*, Vol. 17, No. 3, pp. 136-8 (1989). That is, a blunted Y-junction tip, which results in a substantial amount of optical back-reflection to the optical amplifier which has, because of deleterious effects to the amplifier, prohibited the monolithic integration of a coupled optical amplifier and monitoring photodetector via an optical branching waveguide.

SUMMARY OF THE INVENTION

In this invention, an optical amplifier and a photodetector are integrated on the same semiconductor substrate, the photodetector being optically coupled to the optical amplifier via a branching waveguide having low radiative loss and low back-reflectivity. Importantly, due to the low back-reflectivity, the branching waveguide is able to redirect a small portion of optical radiation from the optical amplifier to the photodetector without deleteriously affecting the performance of the optical amplifier. In particular, the branching waveguide is realized by employing between the branches of the waveguides, a junction region having a gradual decrease in effective refractive index such as to decrease the difference between the effective refractive indices at the optical interface of the truncated wedge tip as seen by optical radiation incident thereto from the optical amplifier.

Advantageously, the ability to monolithically integrate a photodetector and an optical amplifier affords an in-situ means to monitor the thickness of thin-film coatings deposited on the end facets of the amplifier. That is, the coating thickness may be optimized by maximizing the current from the photodetector.

With the gain of the optical amplifier dependent on the polarization of ingressing optical radiation, the device may further be used to measure the state of polarization of ingressing optical radiation incident on the optical amplifier.

BRIEF DESCRIPTION OF THE DRAWING

A more complete understanding of the invention may be obtained by reading the following description in conjunction with the appended drawing in which.

DETAILED DESCRIPTION

Optical amplifiers may be used in long-haul optical fiber communication systems where the information being transmitted is represented by encoded optical radiation which propagates through optical fibers. For error-free transmission, the intensity of the optical radiation should be maintained within a predetermined range, which is normally accomplished by diverting some of the optical radiation from the optical amplifier to a monitoring photodetector. In the prior art, the optical amplifier and photodetector are separate and distinct from each other, coupled externally by a bulk lossy fiber coupler. The monitoring photodetector measures the average power output from the optical amplifier, with a signal generated thereby to control a feedback circuit in order to adjust the optical output power within a desired predetermined range. Importantly, the control of the optical output power of the optical amplifier is necessary to compensate for environmental variations, such as changes in source wavelength and polarization, temperature variations and amplifier degradation. Although a separate monitoring photodetector is adequate for most application, it is highly desirable to have a photodetector integrated with the optical amplifier on the same semiconductor chip.

In this invention, an optical amplifier and monitoring photodetector are monolithically integrated, with the photodetector being optically coupled to the optical amplifier via a branching waveguide having negligible back-reflectivity. Importantly, the branching waveguide, which exhibits low radiative loss as well as low back-reflectivity, is realized by employing between the branches of the waveguide a junction region having a gradual decrease in the effective refractive index along the direction of optical propagation. In particular, this approach minimizes the effect of wedge tip truncation seen for incident optical radiation from the optical amplifier by reducing the difference in the refractive indices at the optical interface of a truncated wedge tip. It should be noted that the effective refractive index in the junction region between the branches specifically varies from the core index to the nominal cladding index of the branching waveguide. Advantageously, the low-reflectivity from the truncated wedge tip allows the optical amplifier to be monolithically integrated with and coupled to a monitoring photodetector because of the high optical isolation afforded by the branching waveguide's low back-reflectivity.

Figure 1:
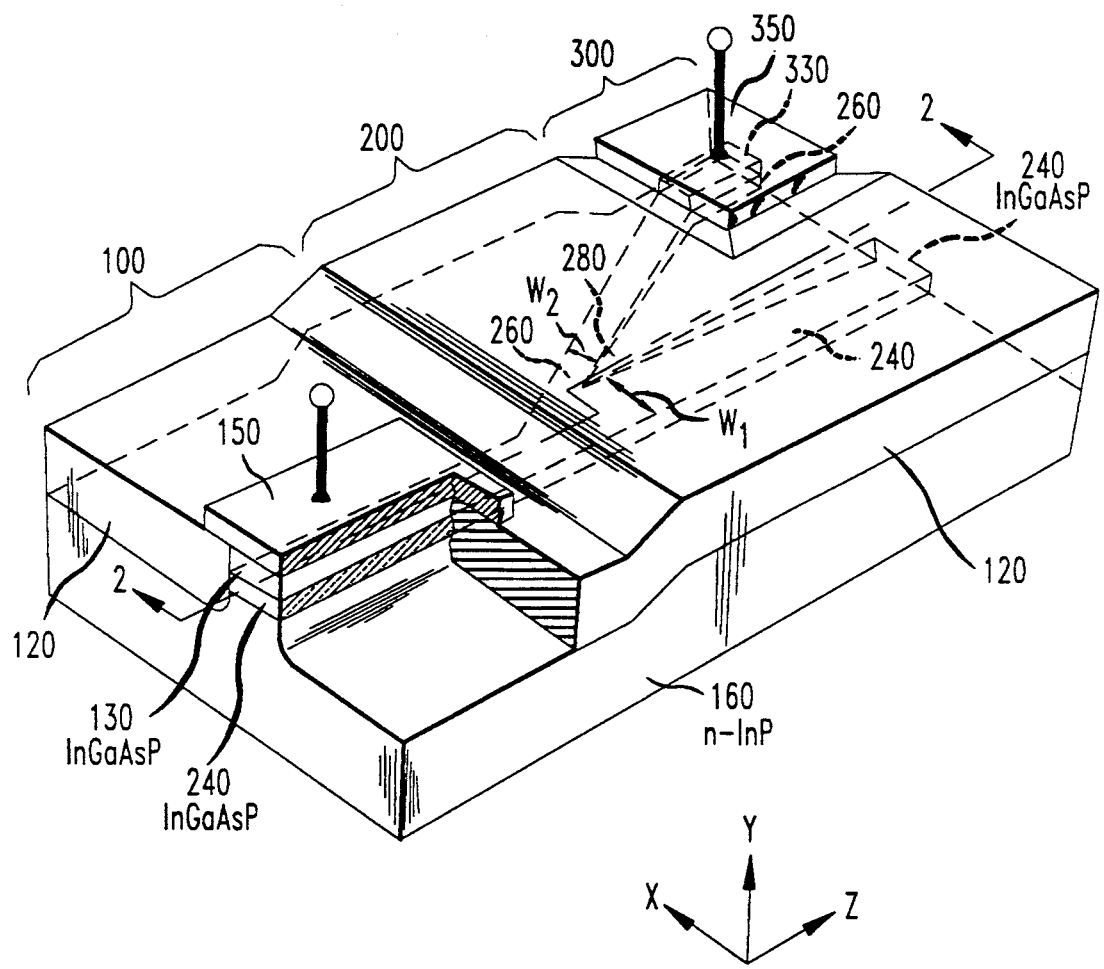
FIG. 1 shows a perspective view of an integrated optical amplifier, Y-junction waveguide and photodetector in accordance with the present invention.

Turning to FIG. 1, there is shown a perspective view of an integrated optical amplifier 100 and monitoring photodetector 300 in accordance with the principles of the invention. A low loss, low reflection asymmetric Y-junction waveguide 200 optically coupled to amplifier 100 redirects a portion of the optical radiation from optical amplifier 100 to monitoring photodetector 300 with negligible back-reflection. The integration of optical amplifier 100 and photodetector 300 is predicated on the ability of Y-junction waveguide 200 to divert a portion of light from optical amplifier 100 to photodetector 300 without substantially reflecting any optical radiation from the truncated wedge tip back to optical amplifier 100. Typical lengths for amplifier 100, Y-junction waveguide 200 and photodetector 300 are 850 μm, 1640 μm and 170 μm, respectively.

Optical amplifier 100, photodetector 300, and Y-junction waveguide 200 are fabricated on n-type, InP substrate 160. In general, in order to fabricate Y-junction waveguide 200, it is generally necessary for the effective refractive index of the material surrounding the waveguiding regions (the cladding) to be less than the effective refractive index of waveguiding regions (the core) such that the structure can guide optical radiation of the appropriate wavelength from optical amplifier 100 by means of total internal reflection to photodetector 300. Y-junction waveguide 200 comprises straight output branch 240 and side branch 260 having a 3.5° bend thereto.

Integrated optical amplifier 100, photodetector 300 and Y-junction waveguide 200 are fabricated from III-V semiconductor materials. Other semiconductor materials, however, may be utilized which have appropriate refractive indices. Standard fabrication techniques such as melta-organic chemical vapor deposition (MOCVD) and regrowth, wet chemical etching, and photolithography are employed to fabricate the structure. These fabrication techniques are well-known to those persons of ordinary skill in the art and, thus, not discussed in detail here.

Figure 2:
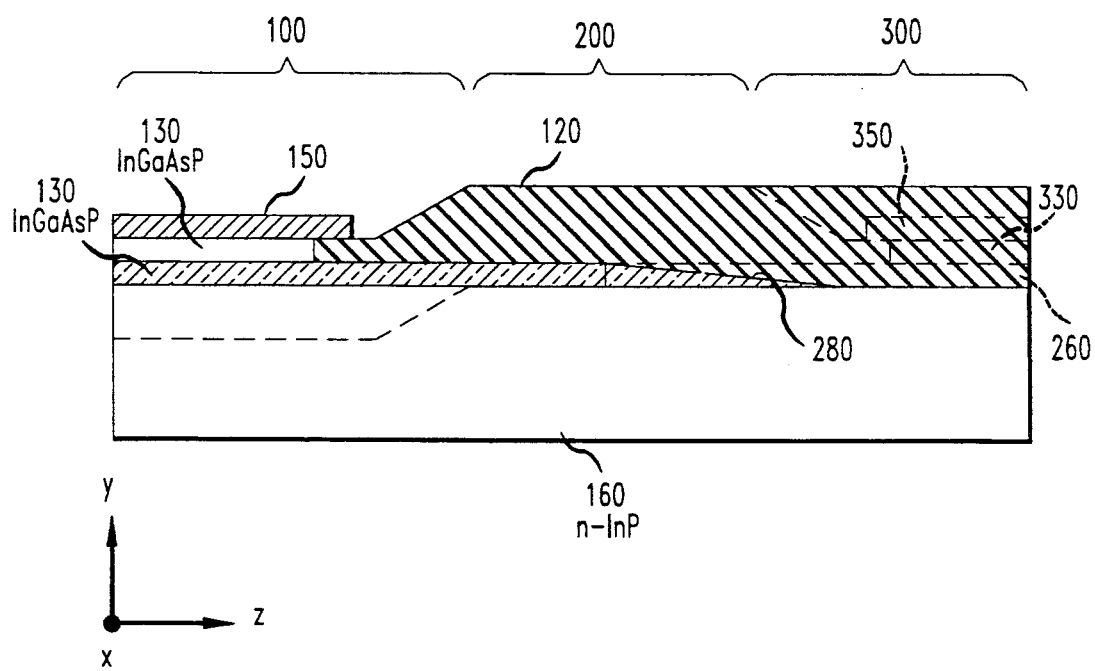
FIG. 2 shows a longitudinal cross section of the optical amplifier, the photodetector and the Y-junction waveguide illustrated in FIG. 1.

In the illustrative embodiment shown in FIG. 1, optical amplifier 100 is optical coupled to p-i-n photodetector 300 via Y-junction waveguide 200. Optical radiation which impinges on the front facet of optical amplifier 100 is amplified by active InGaAsP layer 130 (1.3 μm bandgap layer). Moreover, the confined optical radiation is then coupled to adjacent InGaAsP passive straight branch waveguide 240 (1.1 μm bandgap layer), extending from and underlying active InGaAsP layer 130, as shown in FIG. 2 illustrating the cross sectional thereof. It should be noted that active InGaAsP layer 130 is removed from passive waveguide areas. Straight branch waveguide 240 is used as an output port while side branch waveguide 260 extends to and underlies active InGaAsP layer 330 (1.3 μm bandgap energy layer), optically coupling about 10% of the incident optical radiation to p-i-n detector 300. Similar to a portion of straight branch waveguide 240 in the active amplifier section, side branch waveguide 260 in a portion of the photodetector section is adjacent to active InGaAsP layer 330 for coupling optical radiation to photodetector 300. It should be noted that the location of buried Y-junction waveguide 200, that is straight and side branch waveguides 260 and 240, are shown projected on the top surface by dotted lines.

Both side and straight branch waveguide 260 and 240, respectively, are passive InGaAsP (1.1 μm bandgap) waveguide mesas buried by a semi-insulating InP region 120. Angles other than 3.5° between the branches may be used for different desired power splitting ratio. Generally, the power splitting ratio is controlled by the widths $W_1$ and $W_2$ of straight branch waveguide 240 and side branch waveguide 260, respectively, and the angle $\theta$ between the branches. For higher optical power propagating to straight branch waveguide 240 than side branch waveguide 260, the width $W_2$ should be narrower than the width $W_1$. Furthermore, the angle may be chosen in accordance with the desired power division and is, generally, limited to a few degrees because of fabrication limitations and bending loss considerations.

Importantly, a gradual change in the effective refractive index along the Z-axis in junction region 280 between side branch 260 and straight branch 240 is employed to reduce the effect of the wedge truncation seen by optical radiation eggressing from optical amplifier 100. Typically, the refractive effective index of junction region 280 has a linear gradient index profile along the Z-axis, varying from the core index to the cladding index of straight and side branch waveguides 240 and 260, respectively. Other profiles may, however, be employed such as a parabolic, exponential or step function profile. It is contemplated that in the preferred embodiment, both side and straight branch waveguides are single mode waveguides.

A semi-insulating blocked planar buried heterostructure (SIPBH) waveguide with an active InGaAsP layer (1.3 μm bandgap energy) structure is employed for both optical amplifier 100 and p-i-n photodetector 300. A Fe doped semi-insulating InP region 120 is used for both current blocking and transverse optical confinement in optical amplifier 100 and photodetector 300. Note that the active layer is removed for passive Y-junction waveguide 200 and, thus, optical amplifier 100 and photodetector 300 are similar to Y-junction waveguide 200 except for active InGaAsP layers 130, 330 and p conductivity type layers 150, 350, which facilitate electrical contact to the respective active InGaAsP layers.

Importantly, junction region 280 between the branches of the Y-junction has a gradual change in the effective refractive index along the Z-axis, as discussed aboveherein, to reduce the effect of the wedge tip truncation seen by an optical mode propagating therein from optical amplifier 100. This may be accomplished, as is the case here, by a gradual decrease along the Z-axis in thickness of an InGaAsP region in Y-junction region 280 underlying InP region 120. Semi-insulating InP region 120 is also used for a top passive cladding waveguide region because it has a smaller absorption loss coefficient than p conductivity type layers 150, 350. As an example, passive InGaAsP straight and side waveguides 240 and 260, respectively, and active InGaAsP layers 130, 330 have respective thickness of 0.35 μm and 0.9 μm. Moreover, the widths of both the active and passive waveguides outside Y-junction area 290 are 2.5 μm.

Figure 3:
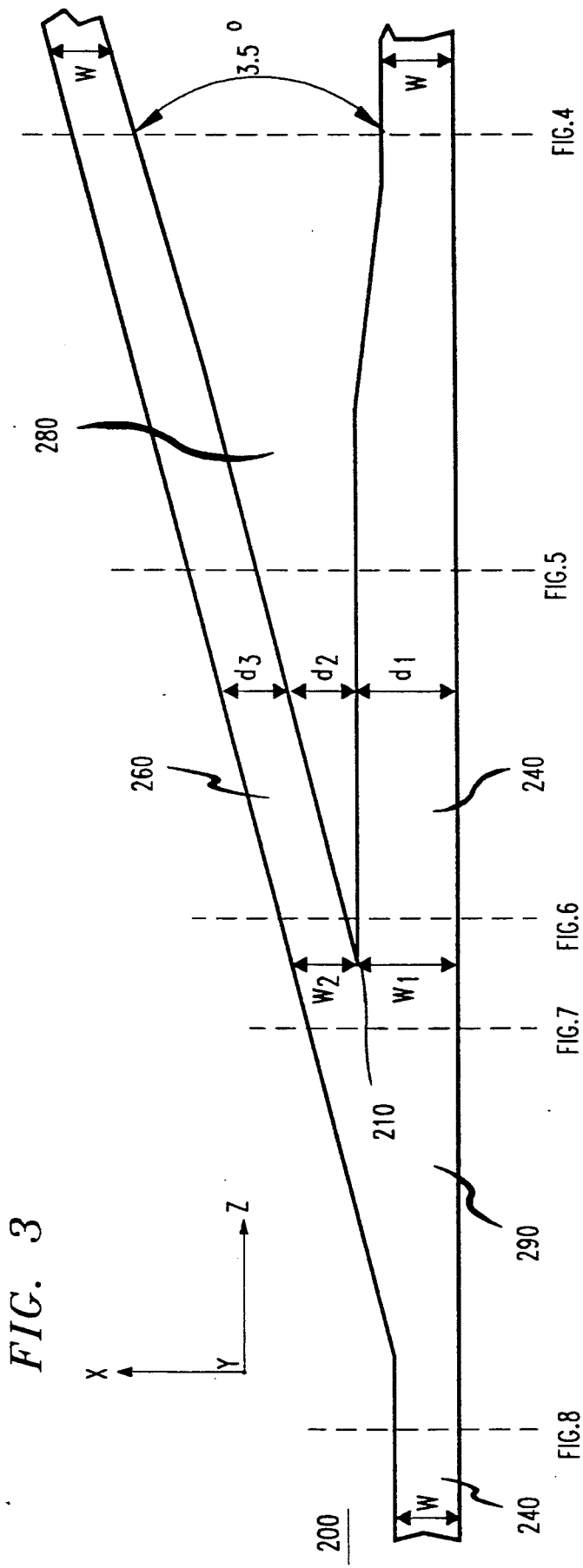
FIG. 3 shows a top plan view of the Y-junction waveguide illustrated in FIG. 1.
Figure 4:
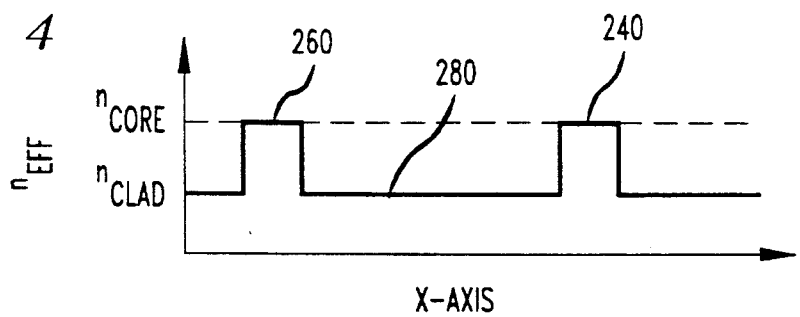
FIGs. 4, 5, 6, 7, and 8 show the effective refractive index profiles (X-axis) of the Y-junction waveguide of FIG. 3 for various planes along the Z-axis.
Figure 5:
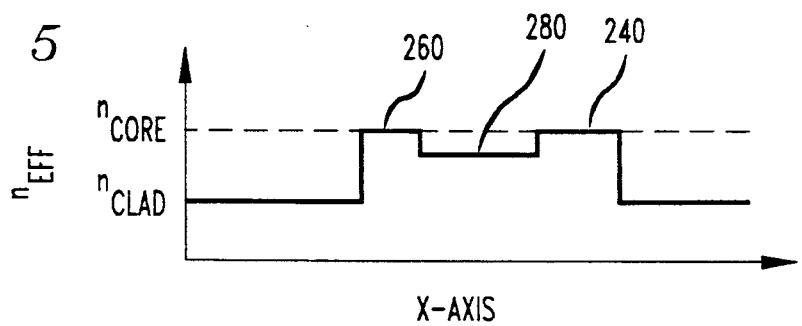
Figure 6:
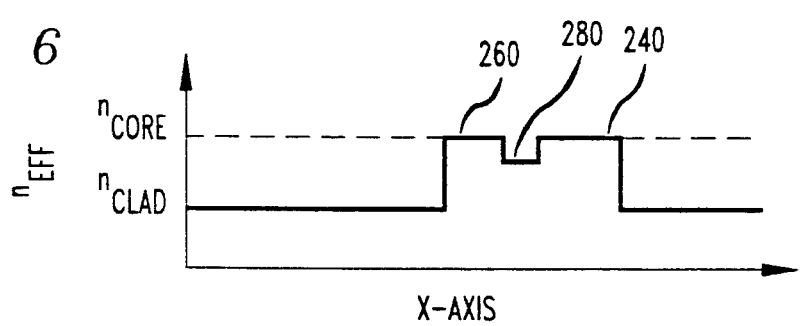
Figure 7:
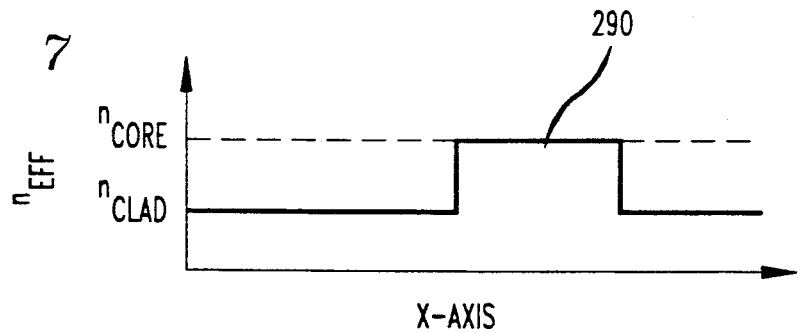
Figure 8:
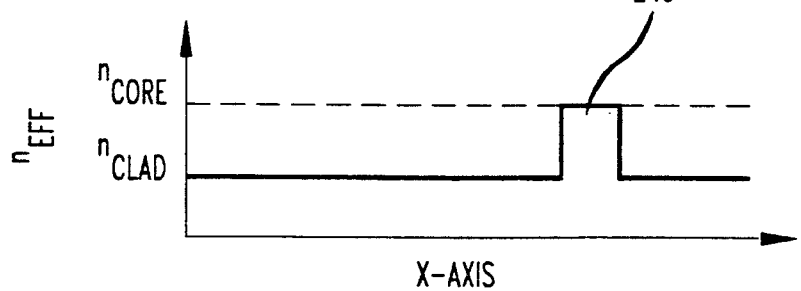

In FIG. 3, a top plan view of Y-junction waveguide 200 is illustrated. For convenience of description, the direction from straight waveguide 240 toward side waveguide 260 is taken as the Z-axis and the direction perpendicular to the plane of the drawing is taken as the Y-axis in order to define a X-Y-Z coordinate system, as shown in FIG. 3. The 2.5 μm width W of the straight branch waveguide 240 is tapered by a 80 μm tapering length for adiabatic mode propagation into Y-junction area 290. Power division occurs by mode conversion at the Y-junction, with the modal behavior dominated by the abrupt transition at the truncated wedge tip 210. The widths of the waveguides at junction tip 210 are 2.2 μm and 3.3 μm for side branch waveguide 260 and straight branch waveguide 240, respectively. Further, the width of truncated wedge tip 210 is 0.8 μm. In this exemplary structure, the widths of both waveguides are tapered back to a width W of 2.5 μm at about 100 μm outside of the Y-junction tip, as shown in FIG. 3.

The integrated structure of optical amplifier 100, p-i-n photodetector 300 and Y-junction waveguide 200 is realized by three epitaxial growth steps and by conventional photolithography and wet chemical etching. That is, a planar metal-organic chemical vapor deposition (MOCVD) growth for InGaAsP active layers 130, 330 and InGaAsP passive waveguide layers 240, 260 followed by two MOCVD regrowths for blocking layers 120 and cap layers 150, 350. After active layers 130, 330 and passive waveguide layer 240, 260 are grown on n-type InP substrate 160, 2-3 μm wide mesas are etched using a $SiO_2$ mask in order to form active regions 130 and 330, and straight branch region 240 and side branch waveguide 260. In particular, Y-junction waveguide mesas and the active waveguide mesas are etched using a $SiO_2$ mask with the straight sections parallel to the [011] orientation. It should be noted that passive Y-junction waveguide 200 will be similar to the active section, that is optical amplifier 100 and photodetector 300, except for active layer 130, 330 and cap layers 150, 350. Typically, the total height of the active waveguide mesas are 1.5-2 μm, and the height of the Y-junction mesa is less than 1 μm. Next, a MOCVD regrowth is performed for forming semi-insulating block InP region 120. The active waveguide is completely planarized with semi-insulating InP region 120, while the passive Y-branch is covered thereby. The $SiO_2$ mask is removed and cap layers 150, 350 grown by MOCVD over active regions 130 and 330 of optical amplifier 100 and photodetector 300, respectively. Cap layers 150, 350 consist of a 1.5 μm p-InP layer followed by a 0.5 μm $p^+$ InGaAs layer.

In order to obtain the effective refractive index profile along various points of the Y-junction waveguide as shown in FIGS. 4 through 8, the processing steps are different than conventional photolithographic steps. The passive InGaAsP between side branch waveguide 260 and straight branch waveguide 240 is only partially removed by a shallow etch when defining waveguide mesas 240 and 260, as discussed above. With the side and straight branch waveguides defined by silicon dioxide mask and the shallow etched Y-junction area covered by photoresist, a second deep etch produces the passive InGaAsP waveguide mesas. The thickness of the shallow etched InGaAsP layer which remains between the two branches is 0.2 μm and tapers to zero over a length of 100 μm from Y-junction tip 210. The regrowth of semi-insulating InP region 120 over the InGaAsP layer buries the passive waveguides, giving the effective refractive index shown in FIGS. 4 through 8. Active layers 130, 330, however, are subsequently covered by a third MOCVD growth of the p-InP and p InGaAs contact layers as discussed above. These layers in the passive waveguide and Y-junction areas are subsequently removed by chemical etching. All the etching steps above are done using standard selective etchants, such as a 2:1 mixture of $HCl:H_3PO_4$ for InP and a 3:1:1 mixture of $H_2SO_4:H_2O_2:H_2O$ for InGaAsP and InGaAs.

Those persons skilled in the art will readily note that optical amplifier 100 is formed by depositing antireflective coatings on the end facets. However, it is further contemplated that optical amplifier 100 may be made into a laser either by integrating a grating in order to provide distributed feedback or by utilizing the Fabry-Perot resonances from the end facets, if made to have a sufficiently high reflectivity. See, for example, K. Y Liou et al., *Appl. Phys. Lett.* Vol. 54 No. 2 pp. 114-6 (1989).

Figure 9:
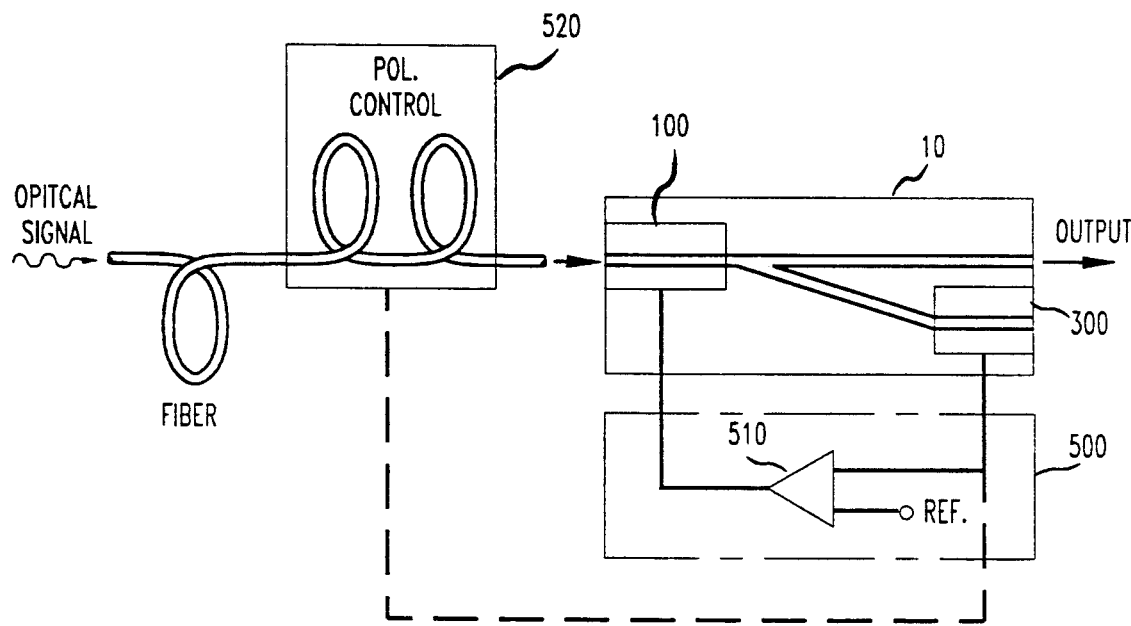
FIG. 9 shows a schematic diagram of the integrated structure of FIG. 1 in an feedback configuration with an external feedback loop for controlling the optical power output of the optical amplifier.
Figure 10:
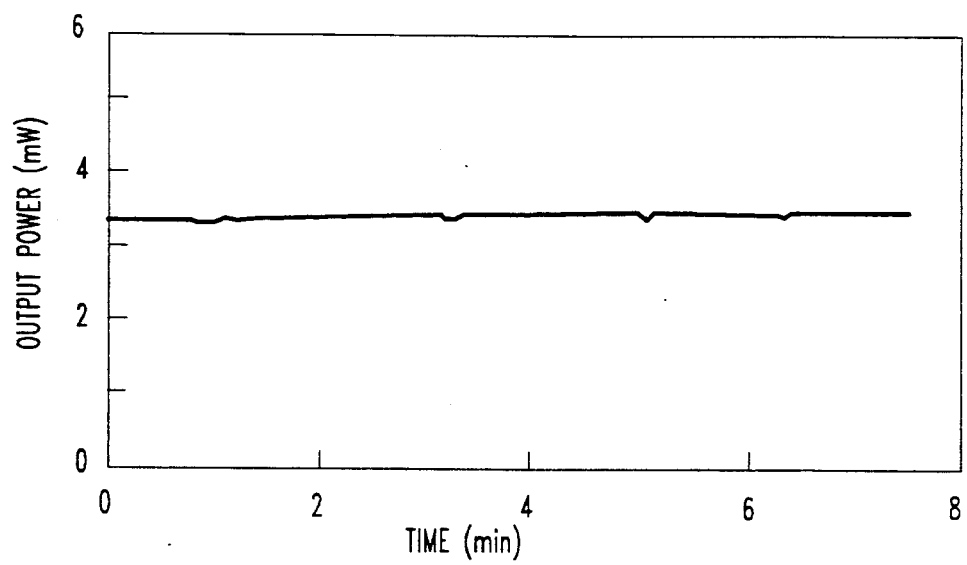
FIG. 10 shows the stabilized output power versus time profile for the feedback configuration illustrated in FIG. 9.

In operation, the current of photodetector 300 tracks the optical amplifier output power. FIG. 9 illustrates a schematic of an external feedback circuit that was added to integrated structure 10 to permit the output power to be automatically maintained constant over a specified range of input power levels and polarization. Feedback circuit 500 compares the current from photodetector 300 with a reference value at differential amplifier 510 that adjusts the bias current to optical amplifier 100. Shown in FIG. 10 is the recorded trace of the amplifier output power as stablized by feedback circuit 500. It should be noted that a constant output power of 3.5 mW is demonstrated with the input power ($>30$ $\mu$W) allowed to vary and the input polarization allowed to rotate about $+/-25°$. Alternatively, since integrated Y-junction waveguide 200 is polarization independent, while optical amplifier 100 is polarization dependent, a fiber polarization controller 520 may be utilized to optimize the optical gain by maximizing current from photodetector 300. That is, polarization controller 520 may be operated electrically via feedback circuit 500 such that the peak photocurrent can be used to automatically maintain maximum amplifier gain.

Figure 11:
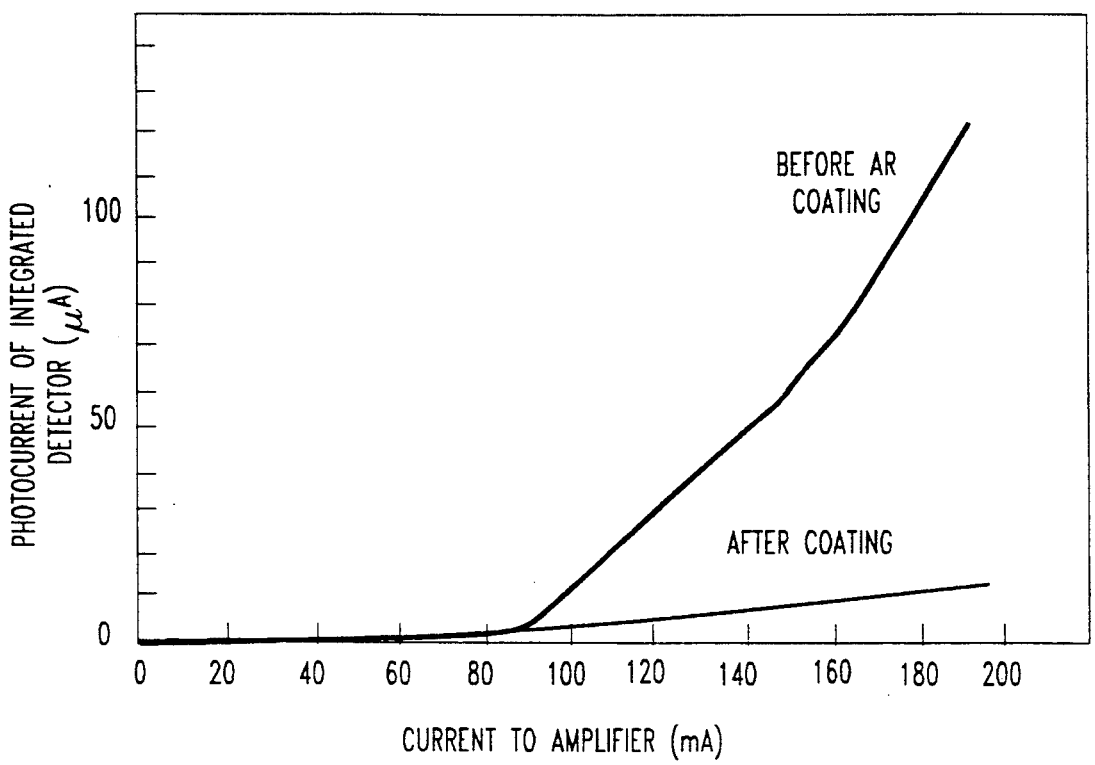
FIG. 11 shows the light versus current profiles for the integrated structure of FIG. 1 before and after antireflective coating an end facet.

Before anti-reflective coating the end facets of the structure of FIG. 1, optical amplifier 100 operates as composite-cavity laser, having approximately a threshold current of 80 mA at 22° C. FIG. 11 illustrates the typical photocurrent generated by unbiased photodetector 300 as a function of the amplifier bias current $I_b$ before and after anti-reflective coating an output facet of integrated structure 10. By coating both facets, a traveling wave amplifier is formed. With an injected current of 130 mA into optical amplifier 100, the spontaneous emission spectrum exhibits ripples of $\sim 0.4$ dB due to residual Fabry-Perot resonances, with mode separation of 0.9 Å. This clearly indicates only residual reflections from the two facets occurs and, more importantly, that negligible reflection occurs at the Y-junction tip. Injecting optical radiation (1.3 $\mu$m wavelength) into active InGaAsP layer 130, the optical signal gain versus injection current was measured for both the TE and TM cases. These measurements indicate approximately a 20 dB gain for TE polarization, with the signal gain a few db less for TM polarization.

It is to be understood that the above described invention is not limited to an optical amplifier, but can be also be used with other devices. Regardless of the specific device use, it is important to be able to monitor and control the output power of the device. Clearly, device structures that incorporate a detector on the same chip as an optical amplifier or the like are important because such integrated devices can provide the full benefits which result from integration, such as compactness, reliability, low cost, and high performance.

It is important to realize that for the structure to be made into an optical amplifier, the end facts of the device must be anti-reflective coated. Otherwise, if the facets of the structure are partially reflective, spontaneous emission that results from current injection will resonate back and forth with each pass to produce lasing. As such, optical amplifiers are critically dependent on the residual reflectivity because any residual reflection causes ripples in the gain spectrum as a result of Fabry-Perot resonances. Currently, the end facets of prior art optical amplifiers are anti-reflective coated by thin film deposition. A primary disadvantage of this methods is that the thickness of coating for optimum performance cannot be accurately monitored in-situ by an external photodetector.

The ability to monolithically integrate a photodetector with an optical amplifier affords an in-situ antireflection coating technique. The coating material may be applied to an exposed facet while the amplifier is biased. In operation, the optimum anti-reflective coating thickness is determined when the photo-generated current from monitoring detector 300 reaches a minimum, for a specific bias current, according to the graph shown in FIG. 11. Note that if a high reflective coating is desired, such as for lasing, the coating thickness may be optimized by maximizing the photocurrent from photodetector 300.

Figure 12:
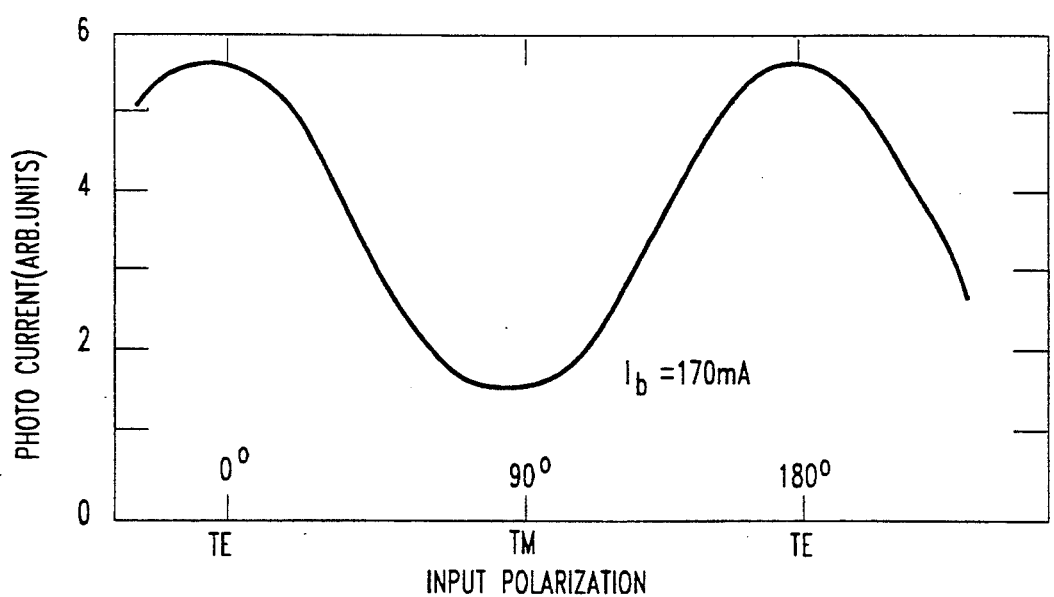
FIG. 12 shows the output power versus input polarization profile for the integrated structure of FIG. 1.

Illustrated in FIG. 12 is the variation of the amplified output power with rotation of the input polarization. Electrically controlling the polarizer in a feedback configuration by the photocurrent realizes a polarization feedback loop which operates automatically to maintain a maximum amplifier gain if the photocurrent is maximized. Additionally, as illustrated by FIG. 12, the photocurrent generated is highly dependent on the polarization of the ingressing optical radiation. Thus, it is possible to measure the degree of polarization by correlating the photocurrent to the state of polarization vis-a-vis FIG. 12. That is, a polarization detector can be realized by utilizing the device of FIG. 1 and measuring the generated photocurrent. Of course, this assumes that the measured photocurrents are normalized.

We claim:

1. A device comprising a photodetector, first and second interconnecting waveguides, and an optical amplifier coupled via at least one of said waveguides to said photodetector, each integrated on a common semiconductor substrate, said second waveguide intersecting and coupled optically to said first waveguide to form a Y-junction having a truncated wedge tip, said Y-junction having a junction region located between said first and second waveguides, and a gradient in the effective refractive index coupled to said junction region along the axis of optical propagation of said first waveguide so as to reduce the difference between the effective refractive indices at the optical interface of said truncated wedge tip for reducing back reflection of optical radiation from said optical amplifier incident on said truncated wedge tip.

2. The device as defined in claim 1 wherein said gradient in effective refractive index varies from the core refractive index to the cladding refractive index of said first waveguide.

3. The device as defined as claim 2 wherein said gradient in the effective refractive index further comprises a first semiconductor material having a gradual decrease in thickness and a second semiconductor material disposed over said first semiconductor material, said first semiconductor material having a higher refractive index than the refractive index of said second semiconductor material.

4. The device as defined in claim 3 wherein said optical amplifier, first and second waveguides and photodetector are integrated on a InP substrate.

5. The device as defined in claim 4 wherein said first and second waveguides comprise passive InGaAsP having a bandgap energy corresponding to a wavelength of 1.1 $\mu$m.

6. The device as defined in claim 5 wherein said optical amplifier further comprises active InGaAsP having a bandgap energy corresponding to a wavelength of 1.3 μm.

7. The device as defined in claim 6 wherein said first and second semiconductor materials comprise InGaAsP and InP, respectively.

8. The device as defined in claim 7 wherein said InP material is semi-insulating.

9. The device as defined in claim 8 wherein said first waveguide intersects said second waveguide at an angle of less than 5°.

10. The device as defined in claim 9 wherein said first and second waveguides are single mode waveguides.

11. The device as defined in claim 10 wherein said first and second waveguides are tapered for adiabatic mode propagation in a region located away from said truncated wedge tip.

12. The device as defined in claim 1 further comprising feedback means jointly coupled to said photodetector and said optical amplifier to control the optical output power of said optical amplifier.

13. A device comprising a photodetector, first and second interconnecting waveguides, on a laser coupled via at least one of said waveguides to said photodetector, each integrated on a common semiconductor substrate, said second waveguide intersecting and coupled optically to said first waveguide to form a Y-junction having a truncated wedge tip, said Y-junction having a truncated wedge tip, said Y-junction having a junction region located between said first and second waveguides, a gradient in the effective refractive index coupled to said junction region along the axis of optical propagation of said first waveguide so as to reduce the difference between the effective refractive indices at the optical interface of said truncated wedge tip for reducing the back reflection of optical radiation from said laser incident on said truncated wedge tip, and feedback means jointly coupled to said photodetector and said laser to control the optical output power of said laser.

14. The device as defined in claim 13 further comprising a feedback means jointly coupled to said photodetector and said laser to control the thickness of a reflective coating deposited on a back facet of said laser such that the optical resonances within the cavity of said laser is maximized.

15. The device as defined in claim 1 further comprising a polarization controller for adjusting the polarization of optical radiation incident on said optical amplifier, and feedback means jointly coupled to said photodetector and said optical amplifier to control the optical output power of said optical amplifier.

16. The device as defined in claim 1 further comprising a polarization controller for adjusting the polarization of optical radiation incident on said optical amplifier, and feedback means jointly coupled to said photodetector and said optical amplifier to maintain maximum amplifier gain.

17. The device as defined in claim 1 further comprising a feedback means jointly coupled to said photodetector and said optical amplifier to control the thickness of an anti-reflective coating deposited on an end facet of said optical amplifier such that Fabry-Perot resonances associated with said end facet are minimized.

* * * * *